United States Patent [19]
Lee et al.

[11] Patent Number: 6,069,812
[45] Date of Patent: May 30, 2000

[54] INTEGRATED CIRCUIT MEMORY DEVICES INCLUDING ROWS OF PADS EXTENDING PARALLEL TO THE SHORT SIDES OF THE INTEGRATED CIRCUIT

[75] Inventors: Yun-sang Lee, Kyungki-do; Jun-young Jeon, Seoul, both of Rep. of Korea

[73] Assignee: Samsung Electronics Co., Ltd., Rep. of Korea

[21] Appl. No.: 09/136,831

[22] Filed: Aug. 20, 1998

[30] Foreign Application Priority Data

Nov. 21, 1997 [KR] Rep. of Korea ..................... 97-62041

[51] Int. Cl.[7] .................................................. G11C 5/02
[52] U.S. Cl. ................................................ 365/51; 365/63
[58] Field of Search ......................... 365/51, 63, 230.03; 257/691

[56] References Cited

U.S. PATENT DOCUMENTS

| | | | |
|---|---|---|---|
| 5,109,265 | 4/1992 | Utesch et al. | 357/45 |
| 5,319,224 | 6/1994 | Sakashita et al. | 257/203 |
| 5,334,873 | 8/1994 | Cha | 257/666 |
| 5,412,613 | 5/1995 | Galbi et al. | 365/63 |
| 5,619,472 | 4/1997 | Okamura | 365/230.03 |
| 5,627,792 | 5/1997 | Tsujimoto | 365/51 |
| 5,659,189 | 8/1997 | Pasch | 257/202 |
| 5,771,200 | 6/1998 | Cho et al. | 365/51 |

FOREIGN PATENT DOCUMENTS 2 259 383  3/1993  United Kingdom .

OTHER PUBLICATIONS

Search Report Under Section 17, GB 9808822.2, Jul. 10, 1998.

*Primary Examiner*—Son T. Dinh
*Attorney, Agent, or Firm*—Myers Bigel Sibley & Sajovec

[57] ABSTRACT

Integrated circuit memory devices include a rectangular integrated circuit memory device substrate that includes a pair of short sides, a pair of long sides and a pair of opposing faces. The substrate also includes an array of memory cells and peripheral circuits therein. A plurality of spaced apart rows of input/output pads on one of the faces extend parallel to the short sides. The face is free of (i.e. does not include) a row of input/output pads that extends parallel to the long sides. The input/output pads are preferably arranged on the integrated circuit memory device substrate, relative to the circuits in the integrated circuit memory device substrate. More specifically, the integrated circuit memory device includes a plurality of memory cell array blocks, first decoder blocks and second decoder blocks in the substrate. A respective first decoder block extends parallel to the short sides adjacent a respective memory cell array block and opposite a short side. A respective second decoder block extends parallel to the long sides, between adjacent memory cell array blocks. The plurality of input/output pads are included between the short sides and the memory cell array blocks adjacent thereto and between the first decoder blocks.

21 Claims, 3 Drawing Sheets

INTEGRATED CIRCUIT MEMORY DEVICES INCLUDING ROWS OF PADS EXTENDING PARALLEL TO THE SHORT SIDES OF THE INTEGRATED CIRCUIT

FIELD OF THE INVENTION

The present invention relates to integrated circuit memory devices such as Dynamic Random Access Memory (DRAM) devices, and more particularly to the layout of integrated circuit memory devices in an integrated circuit.

BACKGROUND OF THE INVENTION

Integrated circuit memory devices such as DRAM devices are widely used in consumer and industrial products. As is well known to those having skill in the art, integrated circuit memory devices include an array of memory cells that are generally arranged in rows and columns. It will be understood that as used herein, rows and columns are used to identify relative directions in an array of memory cells rather than an absolute horizontal or vertical direction. Data is written into and read from selected memory cells using peripheral circuits including decoders and control circuits. The array of memory cells may also be arranged in a plurality of subarray blocks, each having rows and columns.

As the integration density and speed of integrated circuit memory devices continue to increase, efforts have been made to decrease the size of the individual memory cells. Moreover, efforts have also been made to more efficiently lay out or arrange the peripheral circuits in the integrated circuit, so that more of the integrated circuit area may be occupied by memory cells rather than peripheral circuits.

As the integration density of integrated circuit memory devices continues to increase, for example from 256 Kb to 256 Mb and 1 Gb or more, the number of input/output pads may also increase. As is well known to those having skill in the art, integrated circuit memory devices include input/output pads that carry input/output signals including but not limited to power supply, ground, address, data and control signals. Moreover, multibit memory devices are also being produced which may also increase the number of input/output pads. Accordingly, it is desirable to efficiently place the pads on a face of an integrated circuit substrate.

One conventional technique for locating pads on an integrated circuit memory device substrate is described in U.S. Pat. No. 5,109,265 to Utesch et al. entitled "Semiconductor Memory With Connection Pads Disposed in the Interior". FIG. 1 is a reproduction of FIG. 2 of the Utesch et al. patent. As described in the Utesch et al. patent at Column 3, line 29–51, FIG. 1 is a plan view of a semiconductor memory chip. The chip is a 64-megabyte semiconductor memory chip, in which four combined cell field blocks 10 are disposed on the corners of the chip surface 1. Within one combined cell field block 10, four single cell field blocks 8 are disposed rectangularly, with each of the single cell field blocks 8 corresponding to one cell field block 8 of the 16-megabyte semiconductor chip. One driver stage 9 is disposed between each two single cell field blocks 8 inside and parallel to the longer side of a combined cell field block 10. The driver stage 9 amplifies the signals of the word lines of the single cell field blocks 8. The decoder blocks 2, 3 are again disposed on the opposite edges of each two combined cell field blocks 10, but the word decoder blocks 2 do not form a coherent block. In this case, the free surface area 4 that can be used for the peripheral circuit blocks 11, is located only between the decoder blocks 2, 3. The connection paths or pads 5 are disposed inside the free surface area 4, parallel to the word decoders 2 and/or parallel to the bit decoder blocks 3.

Unfortunately, as shown in FIG. 1, some of the pads 5 are disposed between facing decoder blocks 2, which may increase the shorter dimension of the integrated circuit. Moreover, since the pads 5 are disposed in a line between the opposite decoder blocks 2 and 3, it may be difficult to effectively arrange the pads in an integrated circuit memory device.

SUMMARY OF THE INVENTION

Integrated circuit memory devices according to the invention include a rectangular integrated circuit memory device substrate that includes a pair of short sides, a pair of long sides and a pair of opposing faces. The substrate also includes an array of memory cells and peripheral circuits therein. A plurality of spaced apart rows of input/output pads on one of the faces extend parallel to the short sides. The face is free of (i.e. does not include) a row of input/output pads that extends parallel to the long sides. Accordingly, improved pad layout of integrated circuit devices may thereby be provided.

The plurality of spaced apart rows of input/output pads may include first and second rows of input/output pads that extend parallel to the short sides. The first row is adjacent one of the pair of short sides and the second row is adjacent the other of the pair of short sides. At least one row of input/output pads at the center of the face may also be included, that extends parallel to the short sides. The at least one row at the center of the face may be a pair of rows that extends parallel to the short sides. All of the rows of input/output pads preferably extend parallel to the short sides from adjacent one of the pair of long sides to adjacent the other of the pair of long sides.

Input/output pads according to the present invention are preferably arranged on the integrated circuit memory device substrate, relative to the circuits in the integrated circuit memory device substrate. More specifically, the integrated circuit memory device includes a plurality of memory cell array blocks, first decoder blocks and second decoder blocks in the substrate. A respective first decoder block extends parallel to the short sides adjacent a respective memory cell array block and opposite a short side. A respective second decoder block extends parallel to the long sides, between adjacent memory cell array blocks. The integrated circuit memory device also includes a plurality of input/output pads between the short sides and the memory cell array blocks adjacent thereto and between the first decoder blocks.

In a preferred embodiment, the plurality of input/output pads includes first and second rows of input/output pads that extend parallel to the short sides, the first row being between one of the pair of short sides and a plurality of memory cell array blocks, and the second row being between the other of the pair of short sides and the plurality of memory cell blocks. At least one row of input/output pads may also be included that extends parallel to the short sides between the first decoder blocks. The at least one row of input/output pads is preferably a pair of rows of input/output pads that extend parallel to the short sides between the first decoder blocks.

A peripheral circuit block may be included that extends parallel to the short sides between the pair of rows of input/output pads. Alternatively, a pair of peripheral circuit blocks may be included that extend parallel to the short sides between the first decoder blocks. The pair of rows of input/output pads is preferably between the pair of peripheral circuit blocks. The face is free of a row of input/output pads that extends parallel to the long sides. Accordingly, improved layout of input/output pads in integrated circuit memory devices may be provided.

DETAILED DESCRIPTION OF PREFERRED EMBODIMENTS

Figure 1:
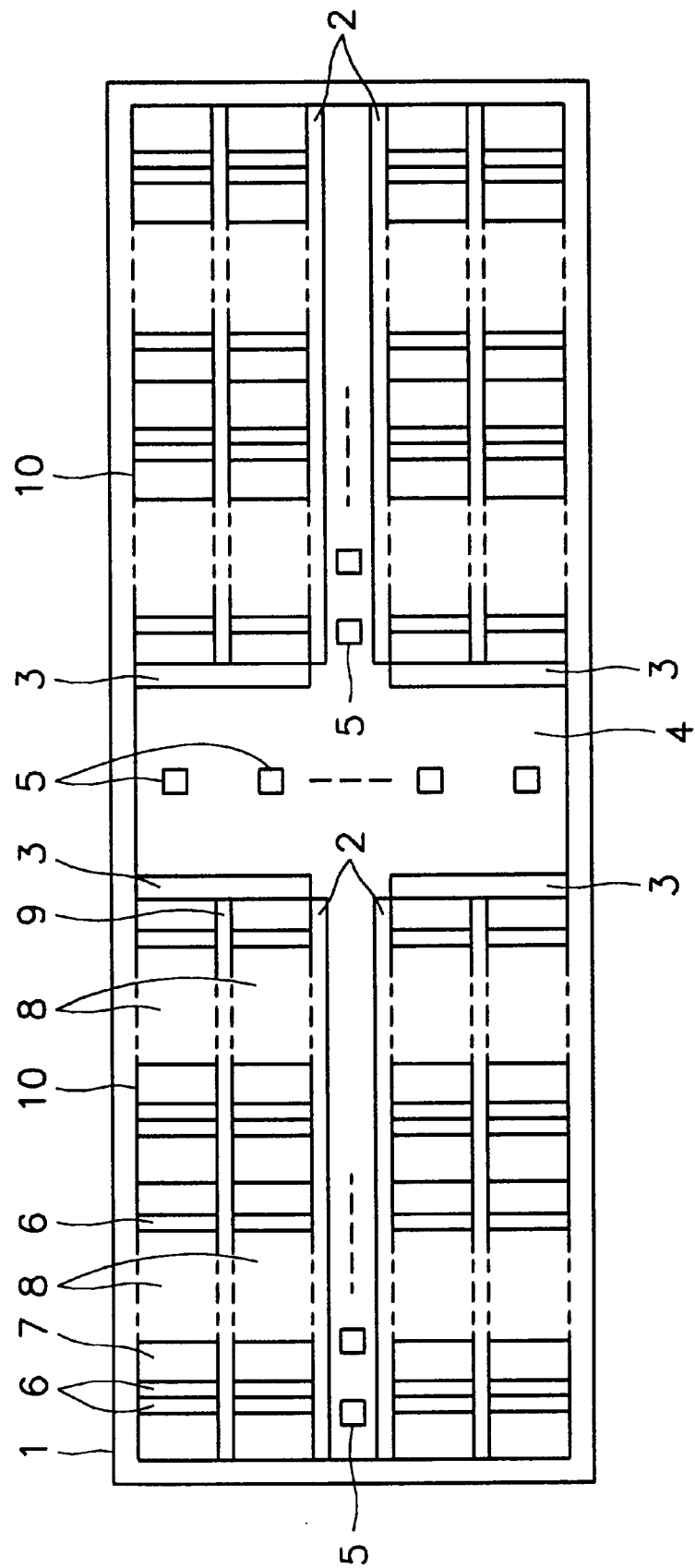
FIG. 1 is top view of a conventional integrated circuit memory device.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the size of layers and regions are exaggerated for clarity. Like numbers refer to like elements throughout. It will be understood that when an element such as a layer, region or substrate is referred to as being "on" another element, it can be directly on the other element or intervening elements may also be present.

Figure 2:
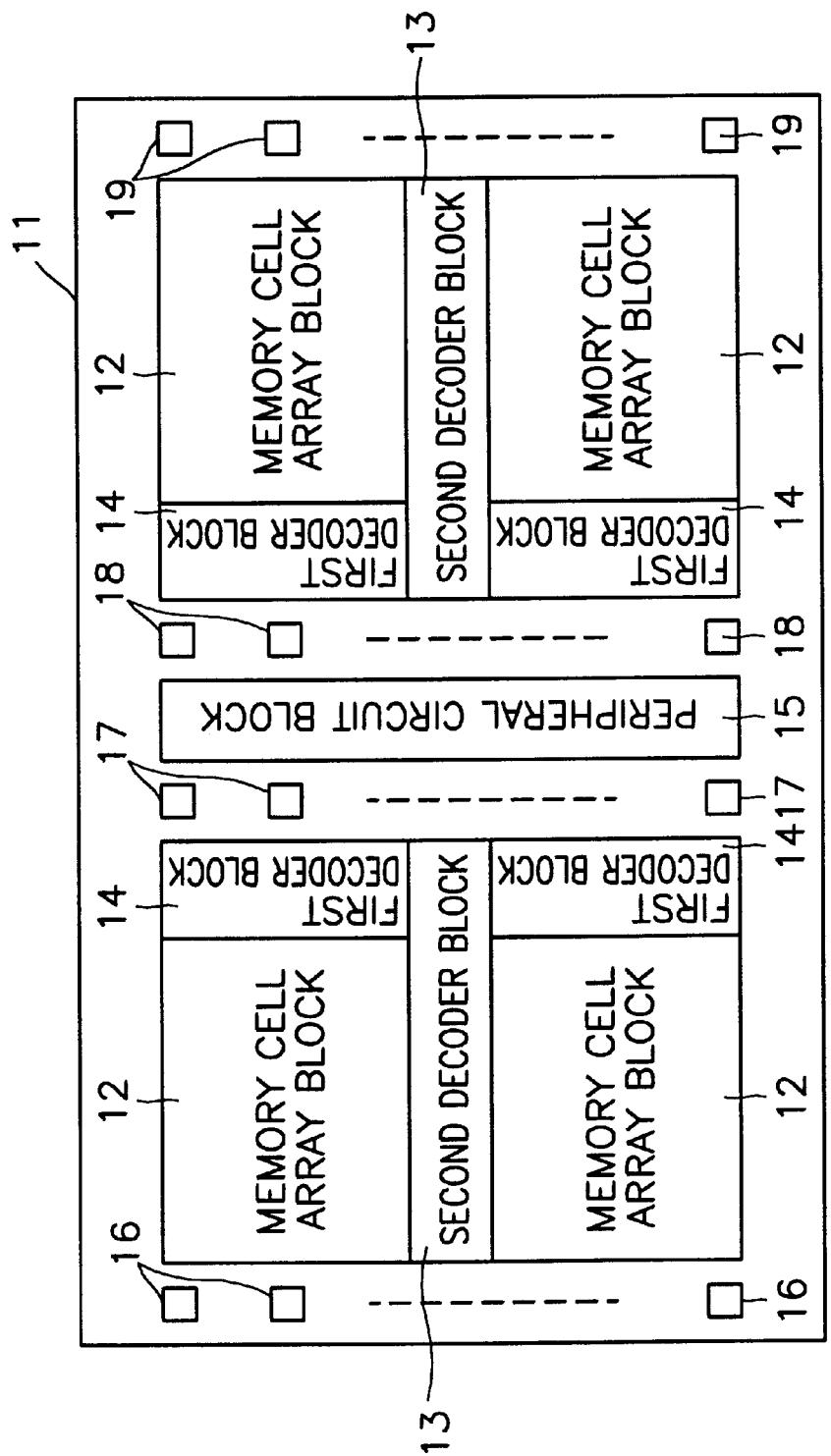
FIG. 2 is top view of integrated circuit memory devices according to a first embodiment of the present invention.

Referring now to FIG. 2, integrated circuit memory devices according to a first embodiment of the present invention include a rectangular integrated circuit memory device substrate 11 that includes a pair of short sides to the left and right of FIG. 2, a pair of long sides at the top and bottom of FIG. 2, and a pair of opposing faces, only one of which is shown in FIG. 2. The integrated circuit memory device includes a plurality of memory cell array blocks 12, first decoder blocks 14 and second decoder blocks 13 in the substrate 11. Preferably, each memory cell array block 12 includes a pair of short sides at the left and right of each memory cell block and a pair of long sides at the top and bottom of each memory cell block. However, the position of the short and long sides of the memory cell array block may be reversed, and the memory cell array blocks may also be square.

As shown in FIG. 2, a respective first decoder block 14 extends parallel to the short sides adjacent a respective memory cell array block 12 and opposite a short side. A respective second decoder block 13 extends parallel to the long sides, between adjacent memory cell array blocks 12.

Still referring to FIG. 2, first and second rows 16 and 19 of input/output pads extend parallel to the short sides. The first row 16 is between one of the pair of short sides and the plurality of memory cell array blocks 12. The second row 19 is between the other of the pair of short sides and the plurality of memory cell blocks. As also shown in FIG. 2, at least one row 17, 18 of input/output pads extends parallel to the short sides between the first decoder blocks 14. More specifically, as shown in FIG. 2, the at least one row of input/output pads is a pair of rows of input/output pads 17, 18 that extend parallel to the short sides between the first decoder blocks 14. A peripheral circuit block 15 may also be included that extends parallel to the short sides between the pair of rows of input/output pads 17 and 18.

As shown in FIG. 2, the face of substrate 11 is free of a row of input/output pads that extends parallel to the long sides. Stated differently, all the rows of input/output pads on the face of substrate 11 extend parallel to the short sides and none of the rows of pads extend parallel to the long sides. Moreover, as shown in FIG. 2, the first row 16, the second row 19 and the at least one row 17 and 18 of input/output pads extend parallel to the short sides from adjacent one of the pair of long sides to adjacent the other of the pair of long sides. Each of the memory cell array blocks 12 is adjacent one of the pair of long sides and one of the pair of short sides. It will also be understood that if the first decoder blocks 14 are row decoders for driving row lines of the memory cell array blocks 12, then the second decoder blocks 13 are column decoders for driving column lines of the memory cell array blocks 12. Conversely, if the first decoder blocks are column decoders for driving column lines of the memory cell array blocks 12, then the second blocks 13 are row decoders for driving row lines of the memory cell array blocks 12.

Figure 3:
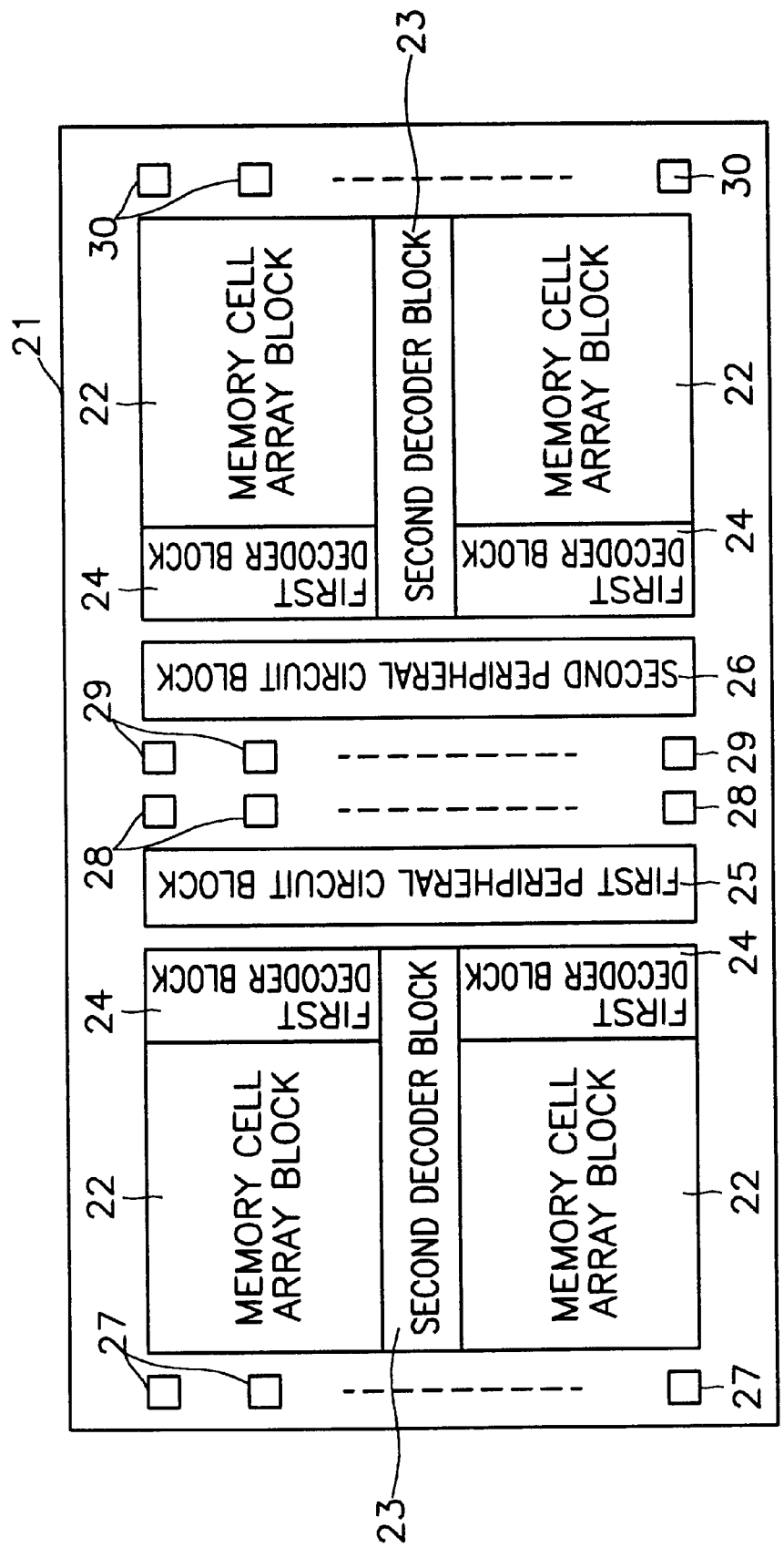
FIG. 3 is atop view of integrated circuit memory devices according to a second embodiment of the present invention.

Referring now to FIG. 3, integrated circuit memory devices according to a second embodiment of the present invention include a rectangular integrated circuit memory device substrate 21 that includes a pair of short sides to the left and right of FIG. 3, a pair of long sides at the top and bottom of FIG. 3, and a pair of opposing faces, only one of which is shown in FIG. 3. The integrated circuit memory device includes a plurality of memory cell array blocks 22, first decoder blocks 24 and second decoder blocks 23 in the substrate 21. Preferably, each memory cell array block 22 includes a pair of short sides at the left and right of each memory cell block and a pair of long sides at the top and bottom of each memory cell block. However, the position of the short and long sides of the memory cell array block may be reversed, and the memory cell array blocks may also be square.

As shown in FIG. 3, a respective first decoder block 24 extends parallel to the short sides adjacent a respective memory cell array block 22 and opposite a short side. A respective second decoder block 23 extends parallel to the long sides, between adjacent memory cell array blocks 22.

Still referring to FIG. 3, first and second rows 27 and 30 of input/output pads extend parallel to the short sides. The first row 27 is between one of the pair of short sides and the plurality of memory cell array blocks 22. The second row 30 is between the other of the pair of short sides and the plurality of memory cell blocks. As also shown in FIG. 3, at least one row 28, 29 of input/output pads extends parallel to the short sides between the first decoder blocks 24. More specifically, as shown in FIG. 2, the at least one row of input/output pads is a pair of rows of input/output pads 28, 29 that extend parallel to the short sides between the first decoder blocks 24.

In the second embodiment of FIG. 3, a pair of peripheral circuit blocks 25, 26 is included that extends parallel to the short sides between the first decoder blocks 24. As shown in FIG. 3, the pair of rows of input/output pads 28 and 29 is between the pair of peripheral circuit blocks 25 and 26.

As shown in FIG. 3, the face of substrate 21 is free of a row of input/output pads that extends parallel to the long sides. Stated differently, all the rows of input/output pads on the face of substrate 21 extend parallel to the short sides and none of the rows of pads extend parallel to the long sides. Moreover, as shown in FIG. 2, the first row 27, the second row 30 and the at least one row 27 and 28 of input/output pads extend parallel to the short sides from adjacent one of the pair of long sides to adjacent the other of the pair of long sides. Each of the memory cell array blocks 22 is adjacent one of the pair of long sides and one of the pair of short sides. It will also be understood that if the first decoder blocks 24 are row decoders for driving row lines of the memory cell array blocks 22, then the second decoder blocks 23 are column decoders for driving column lines of the memory cell array blocks 22. Conversely, if the first decoder blocks are column decoders for driving column lines of the memory cell array blocks 22, then the second blocks 23 are row decoders for driving row lines of the memory cell array blocks 22.

As shown in FIGS. 2 and 3, input/output pads are not included adjacent the second decoder blocks 13 and 23. The shorter dimension of the integrated circuit substrate can therefore be reduced. Accordingly, even though the integration density of the integrated circuit memory device increases, the shortest dimension of the integrated circuit substrate need not be unduly increased. Moreover, some of the pads 16, 27, 19 and 30 are located between the short sides of the integrated circuit substrate and the short edges of the memory cell array blocks 12 and 22. This can allow an increase in the number of pads that can be placed in the integrated circuit. The space between the pads may be sufficient so that circuits may be disposed around the pads. The distance between the peripheral circuits may also be reduced, to thereby facilitate signal transmission. High density integrated circuit memory devices may thereby be provided.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit memory device comprising:
   a rectangular integrated circuit memory device substrate including a pair of short sides, a pair of long sides and a pair of opposing faces, the substrate also including an array of memory cells and peripheral circuits therein; and
   a plurality of spaced apart rows of input/output pads on one of the faces that extend parallel to the short sides, the face being free of a row of input/output pads that extends parallel to the long sides, the plurality of spaced apart rows of input/output pads comprising first and second rows of input/output pads that extend parallel to the short sides, the first row being adjacent one of the pair of short sides and the second row being adjacent the other of the pair of short sides.

2. An integrated circuit memory device according to claim 1 wherein the plurality of spaced apart rows of input/output pads further comprises at least one row of input/output pads at the center of the one of the faces that extends parallel to the short sides.

3. An integrated circuit memory device according to claim 2 wherein the at least one row of input/output pads at the center of the one of the faces is a pair of rows of input/output pads at the center of the one of the faces that extend parallel to the short sides.

4. An integrated circuit memory device according to claim 2 wherein the first and second row and the at least one row of input/output pads extend parallel to the short sides, from adjacent one of the pair of long sides to adjacent the other of the pair of long sides.

5. An integrated circuit memory device comprising:
   a rectangular integrated circuit memory device substrate including a pair of short sides, a pair of long sides and a pair of opposing faces;
   a plurality of memory cell array blocks, first decoder blocks and second decoder blocks in the substrate, a respective first decoder block extending parallel to the short sides, adjacent a respective memory cell array block and opposite a short side, and a respective second decoder block extending parallel to the long sides, between adjacent memory cell array blocks; and
   first and second rows of input/output pads that extend parallel to the short sides, the first row being between one of the pair of short sides and the plurality of memory cell array blocks and the second row being between the other of the pair of short sides and the plurality of memory cell blocks.

6. An integrated circuit memory device according to claim 5 further comprising at least one row of input/output pads that extends parallel to the short sides between the first decoder blocks.

7. An integrated circuit memory device according to claim 6 wherein the at least one row of input/output pads is a pair of rows of input/output pads that extend parallel to the short sides between the first decoder blocks.

8. An integrated circuit memory device according to claim 7 further comprising a peripheral circuit block that extends parallel to the short sides between the pair of rows of input/output pads.

9. An integrated circuit memory device according to claim 7 further comprising a pair of peripheral circuit blocks that extend parallel to the short sides between first decoder blocks, the pair of rows of input/output pads being between the pair of peripheral circuit blocks.

10. An integrated circuit memory device according to claim 5 wherein the face is free of a row of input/output pads that extends parallel to the long sides.

11. An integrated circuit memory device according to claim 6 wherein the first and second row and the at least one row of input/output pads extend parallel to the short sides, from adjacent one of the pair of long sides to adjacent the other of the pair of long sides.

12. An integrated circuit memory device according to claim 5 wherein each of the memory cell array blocks is adjacent one of the pair of long sides and one of the pair of short sides.

13. An integrated circuit memory device according to claim 5 wherein the first decoder blocks are row decoder blocks and wherein the second decoder blocks are column decoder blocks.

14. An integrated circuit memory device comprising:
   a rectangular integrated circuit memory device substrate including a pair of short sides, a pair of long sides and a pair of opposing faces;
   a plurality of memory cell array blocks, first decoder blocks and second decoder blocks in the substrate, a respective first decoder block extending parallel to the short sides, adjacent a respective memory cell array block and opposite a short side, and a respective second decoder block extending parallel to the long sides, between adjacent memory cell array blocks; and
   a plurality of input/output pads between the short sides and the memory cell array blocks adjacent thereto and between the first decoder blocks.

15. An integrated circuit memory device according to claim 14 wherein the plurality of input/output pads comprises first and second rows of input/output pads that extend parallel to the short sides, the first row being between one of the pair of short sides and the plurality of memory cell array blocks and the second row being between the other of the pair of short sides and the plurality of memory cell blocks.

16. An integrated circuit memory device according to claim 15 wherein the plurality of input/output pads further comprises at least one row of input/output pads that extends parallel to the short sides between the first decoder blocks.

17. An integrated circuit memory device according to claim 16 wherein the at least one row of input/output pads is a pair of rows of input/output pads that extend parallel to the short sides between the first decoder blocks.

18. An integrated circuit memory device according to claim 17 further comprising a peripheral circuit block that extends parallel to the short sides between the pair of rows of input/output pads.

19. An integrated circuit memory device according to claim 17 further comprising a pair of peripheral circuit blocks that extend parallel to the short sides between first decoder blocks, the pair of rows of input/output pads being between the pair of peripheral circuit blocks.

20. An integrated circuit memory device comprising:
a rectangular integrated circuit memory device substrate including a pair of short sides, a pair of long sides and a pair of opposing faces, the substrate also including an array of memory cells and peripheral circuits therein; and
at least one spaced apart row of input/output pads on one of the faces at the center thereof, that extends parallel to the short sides, the face being free of a row of input/output pads that extends parallel to the long sides.

21. An integrated circuit memory device according to claim 20, wherein the at least one row of input/output pads at the center of the one of the faces is a pair of rows of input/output pads at the center of the one of the faces that extend parallel to the short sides.

* * * * *